United States Patent
Koge et al.

(10) Patent No.: US 8,043,903 B2
(45) Date of Patent: Oct. 25, 2011

(54) METHOD OF MANUFACTURING SEMICONDUCTOR DEVICE

(75) Inventors: Katsumi Koge, Tokyo (JP); Teruyuki Mine, Tokyo (JP); Yasushi Yamazaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/895,988

(22) Filed: Oct. 1, 2010

(65) Prior Publication Data

US 2011/0081761 A1 Apr. 7, 2011

(30) Foreign Application Priority Data

Oct. 5, 2009 (JP) .................. 2009-231725

(51) Int. Cl.
*H01L 21/00* (2006.01)
*H01L 21/8238* (2006.01)
*H01L 21/302* (2006.01)

(52) U.S. Cl. ........ 438/156; 438/212; 438/268; 438/270; 438/745; 257/302; 257/E21.214; 257/E21.228; 257/E21.41

(58) Field of Classification Search .................. 438/156, 438/164, 212, 268, 270; 257/302
See application file for complete search history.

(56) References Cited

U.S. PATENT DOCUMENTS

2007/0246774 A1* 10/2007 Chung et al. .................. 257/347
2009/0267125 A1* 10/2009 Mikasa et al. ................. 257/300

FOREIGN PATENT DOCUMENTS

| JP | 09-232535 | 9/1997 |
| JP | 2007-158269 | 6/2007 |
| JP | 2007-194333 | 8/2007 |
| JP | 2007-258660 | 10/2007 |

* cited by examiner

*Primary Examiner* — Hsien Ming Lee
(74) *Attorney, Agent, or Firm* — Young & Thompson

(57) ABSTRACT

A method of manufacturing a semiconductor device may include, but is not limited to the following processes. A first recess is formed in a semiconductor substrate to define an active region on the semiconductor substrate. The active region includes a protruding portion of the semiconductor substrate surrounded by the first recess. The protruding portion has a sloped side surface. A first insulating film that fills the first recess is formed. A gate recess is formed in the active region to form a thin film portion that upwardly extends. The thin film portion is positioned between the gate recess and the first insulating film. The thin film portion is a part of the protruding portion. An upper part of the thin film portion is removed by wet-etching to adjust a height of the thin film portion.

20 Claims, 20 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device.

Priority is claimed on Japanese Patent Application No 2009-231725, filed Oct. 5, 2009, the content of which is incorporated herein by reference.

2. Description of the Related Art

With the miniaturization of semiconductor devices, the gate length of MOS transistors has been reduced. Regarding planar MOS transistors, the reduction in the gate length causes the short channel effect. Consequently, the threshold voltage is reduced, thereby causing an increase in off-current.

Japanese Patent Laid-Open Publication No. 2007-158269 discloses a semiconductor device and a method of manufacturing the same. The semiconductor device includes a channel portion between an STI (Shallow Trench Isolation) region and a gate trench. Japanese Patent Laid-Open Publication No. 2007-258660 discloses a semiconductor device including a recessed channel region and a method of manufacturing the same.

The semiconductor devices of the above related art include a recessed channel region between a recessed gate electrode and an element isolation region. Hereinafter, such transistors as disclosed in the above related art are referred to as RC (Recessed Channel) transistors.

Japanese Patent Laid-Open Publication No. H09-232535 discloses a method of manufacturing a semiconductor device in which a photolithography process for forming a trench and a photolithography process for forming a gate electrode are carried out in one process. Compared to the trench gate transistor, which is formed by simply embedding a gate electrode in a trench, the RC transistor is a higher performance transistor that can prevent a decrease in the threshold voltage and increase the on-current as much as possible.

The operation characteristics of the RC transistor vary according to the shape and height of the channel region adjacent to a side surface of the recess. It is important to optimize the shape and height of the channel region of the RC transistor according to the electrical characteristics required for a device to which the RC transistor is applied.

Regarding the methods of the related art, however, it has been difficult to precisely adjust and properly process the shape and height of the channel region. Further, a bur portion is likely to remain. The bur portion is a thin semiconductor layer, which covers a side surface of the element isolation region. For this reason, it has been difficult to remove the bur portion while maintaining the shape and height of the channel region.

Japanese Patent Laid-Open Publication No. 2007-194333 discloses a method of removing a bur portion (Si bur) which remains and covers a side surface of an element isolation region of a trench gate transistor. The bur portion affects operations of the trench gate transistor. However, an object of the method is to completely remove the bur portion or to reduce the size of the bur portion to 10 nm or less. For this reason, the amount of the removed silicon substrate is so large. Therefore, the method of the related art cannot be applied to an RC transistor including, as a channel region, a semiconductor layer forming a Si bur portion.

Thus, according to the methods of the related art, it has been difficult to adjust the height of the channel region of the RC transistor to be in a desired range. Further, it has been difficult to completely remove the bur portion remaining adjacent to the channel region.

SUMMARY

In one embodiment, a method of manufacturing a semiconductor device may include, but is not limited to the following processes. A first recess is formed in a semiconductor substrate to define an active region on the semiconductor substrate. The active region includes a protruding portion of the semiconductor substrate surrounded by the first recess. The protruding portion has a sloped side surface. A first insulating film that fills the first recess is formed. A gate recess is formed in the active region to form a thin film portion that upwardly extends. The thin film portion is positioned between the gate recess and the first insulating film. The thin film portion is a part of the protruding portion. An upper part of the thin film portion is removed by wet-etching to adjust a height of the thin film portion.

In another embodiment, a method of manufacturing a semiconductor device may include, but is not limited to the following processes. A first recess is formed in a semiconductor substrate to define an active region on the semiconductor substrate. The active region includes a first protruding portion of the semiconductor substrate surrounded by the first recess. A mask insulating film is formed on a side surface of the first protruding portion. A second recess is formed under the first recess using the mask insulating film as a part of a dry-etching mask to form a second protruding portion under the first protruding portion. The second protruding portion has a sloped side surface. The active region includes the second protruding portion of the semiconductor substrate surrounded by the second recess. A first insulating film filling the first and second recesses is formed. A gate recess is formed in the active region to form a thin film portion that upwardly extends. The thin film portion is positioned between the gate recess and the first insulating film. The thin film portion is a part of the second protruding portion. A bottom surface of the gate recess reaches to the second protruding portion. An upper part of the thin film portion is removed by wet-etching to adjust a height of the thin film portion.

In still another embodiment, a method of manufacturing a semiconductor device may include, but is not limited to the following processes. A recess is formed in a semiconductor substrate to form a thin film portion. The semiconductor substrate has a sloped side surface. The thin film portion is a part of the semiconductor substrate. The thin film portion upwardly extends along a side surface of the recess. An upper part of the thin film portion is removed by wet-etching to adjust a height of the thin film portion.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

First Embodiment

Hereinafter, a method of manufacturing a semiconductor device according to a first embodiment of the present invention is explained with reference to FIGS. 1 to 18B. FIGS. 1 to 18B illustrate a process flow indicative of a method of manufacturing an RC transistor exemplifying the semiconductor device of the first embodiment.

Figure 1:
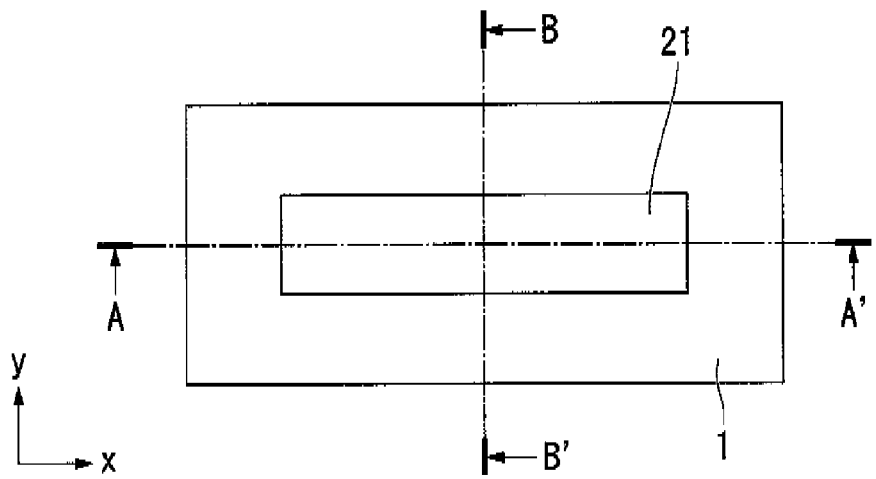
FIGS. 1 to 18B illustrate a process flow indicative of a method of manufacturing a semiconductor device according to a first embodiment of the present invention.
Figure 2A:
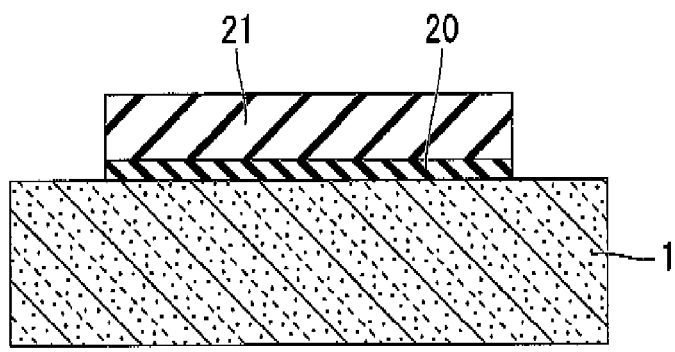
Figure 2B:
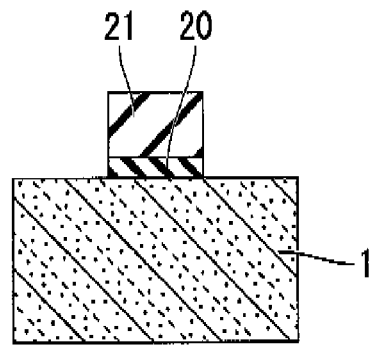

FIG. 1 is a plan view illustrating a state of a silicon nitride film 21 being formed. FIGS. 2A and 2B are cross-sectional views taken along lines A-A' and B-B' shown in FIG. 1, respectively. An X direction and a Y direction perpendicular to the X direction are defined as shown in FIG. 1. The lines A-A' and B-B' are parallel to the X and Y directions, respectively.

Firstly, a semiconductor substrate (silicon substrate) 1 is formed. The semiconductor substrate 1 is made of silicon into which a p-type impurity is introduced. Then, a silicon oxide film 20, which has a thickness of approximately 9 nm, is formed over the semiconductor substrate 1. Then, a silicon nitride ($Si_3N_4$) film 21, which has a thickness of approximately 120 nm, is formed over the silicon oxide film 20.

Then, a photoresist film (not shown) is formed over the silicon nitride film 21. Then, the photoresist film is exposed to form a desired mask pattern. A stack of the silicon nitride film 21 and the silicon oxide film 20 is patterned by dry etching using the mask pattern. Thus, the patterned stack of the silicon oxide film 20 and the silicon nitride film 21, which is rectangular in plan view, is formed as shown in FIGS. 1, 2A, and 2B. In this case, the silicon nitride film 21 is formed so as to cover a diffusion (active) region 2 that will be explained later.

FIGS. 3A to 7B illustrate a process of forming an element formation region 3 using an STI (Shallow Trench Isolation) method. FIGS. 3A to 7A are cross-sectional views taken along the line A-A' shown in FIG. 1. FIGS. 3B to 7B are cross-sectional views taken along the line B-B' shown in FIG. 1.

Figure 3A:
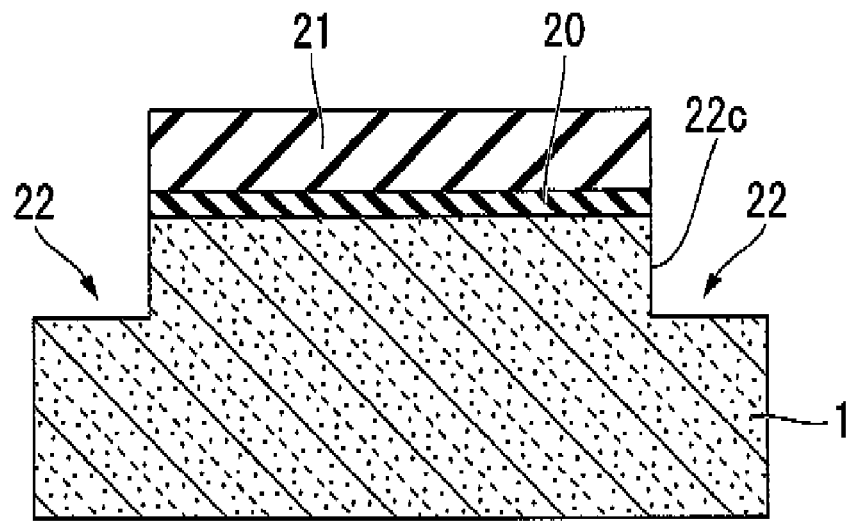
Figure 3B:
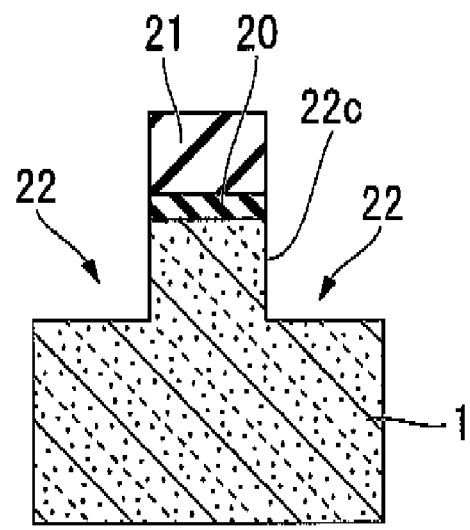

FIGS. 3A and 3B illustrate a state of a first recess 22 being formed. After the silicon nitride film 21 is formed, the silicon substrate 1 is dry-etched using the silicon nitride film 21 as a mask. Thus, the first recess 22 is formed in a region of the semiconductor substrate 1, which is not covered by the silicon nitride film 21, as shown in FIGS. 3A and 3B. The first recess 22 has a depth of approximately 120 nm. The first recess 22 extends in the X and Y directions. In this case, a side surface 22c of the first recess 22 vertically extends from an etched surface of the semiconductor substrate 1. In other words, an angle between the side surface 22c of the first recess 22 and a vertical line is substantially zero.

As the dry etching, an anisotropic dry etching is carried out using a gas containing chlorine ($Cl_2$), hydrogen bromide (HBr), and oxygen ($O_2$), at a pressure of 10 mTorr to 50 mTorr.

Figure 4A:
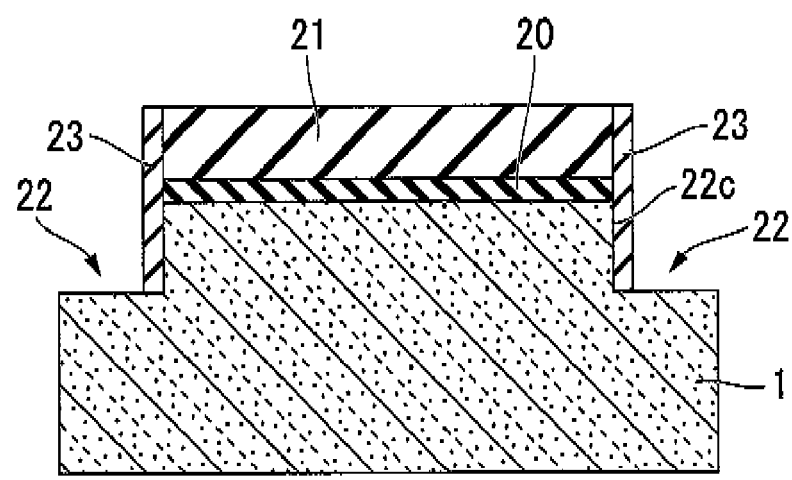
Figure 4B:
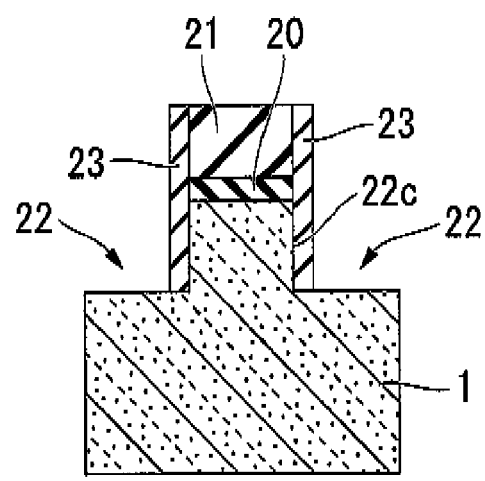

FIGS. 4A and 4B illustrate a state of a sidewall 23 being formed. After the first recess 22 is formed, a silicon oxide film is formed by CVD so as to cover an inner surface of the first recess 22 and an upper surface of the silicon nitride film 21. The silicon oxide film has a thickness of approximately 15 nm to 20 nm. Then, dry etching is carried out to form a sidewall 23 covering the side surface 22c of the first recess 22, as shown in FIGS. 4A and 4B.

Figure 5A:
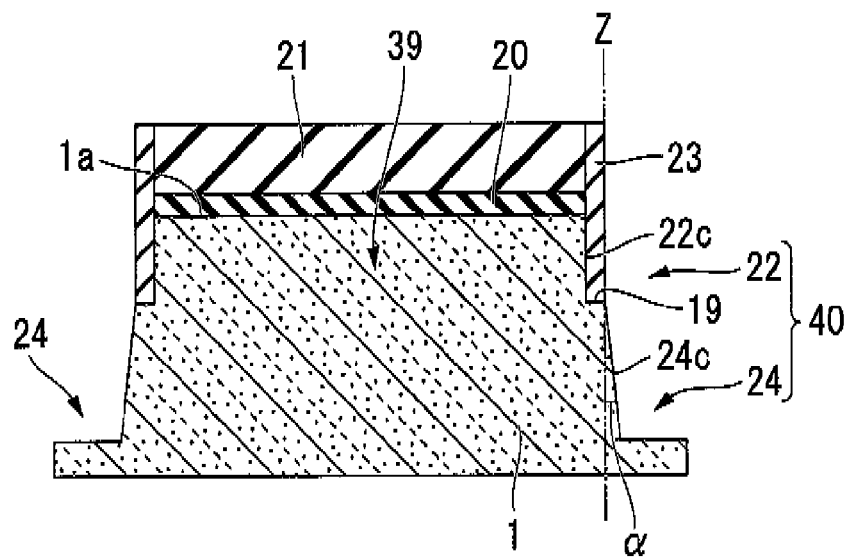
Figure 5B:
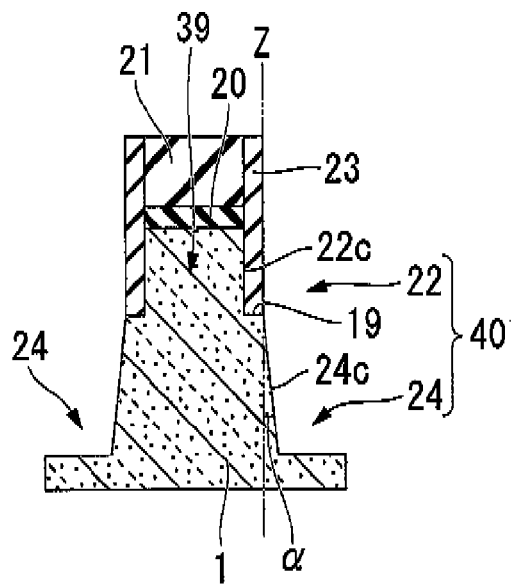

FIGS. 5A and 5B illustrate a state of a second recess 24 being formed. After the sidewall 23 is formed, the silicon substrate 1 is dry-etched using the silicon nitride film 21 and the sidewall 23 as masks. Thus, the second recess 24, which has a depth of approximately 80 nm to 100 nm, is formed. A side surface of the second recess 24 is inclined such that an angle between a vertical line and the side surface of the second recess 24 is α. In other words, a protruding portion 39 of the semiconductor substrate 1 becomes wider in a downward direction.

Thus, a recess 40 and the protruding portion 39 are formed as shown in FIGS. 5A and 5B. The recess 40 includes the first and second recesses 22 and 24. The protruding portion 39 is defined by the recess 40. A side surface of the protruding portion 39 includes an upper portion, a lower portion, and a step portion 19 connecting the upper and lower portions. The upper portion is a part of the side surface 22c of the first recess 22, which is perpendicular to the surface 1a of the semiconductor substrate 1. The lower portion is an inclined surface 24c of the second recess 24. The step portion 19 is parallel to the surface 1a of the semiconductor substrate 1.

Figure 6A:
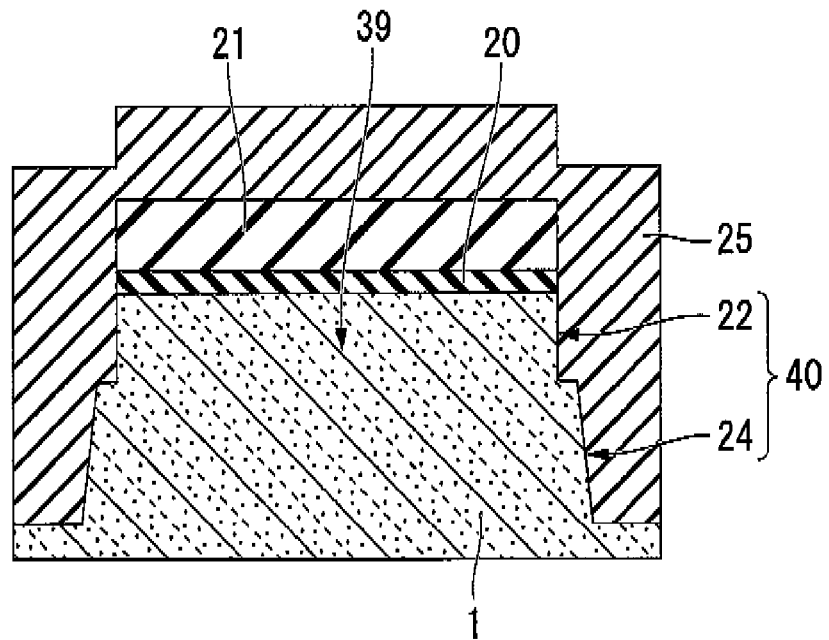
Figure 6B:
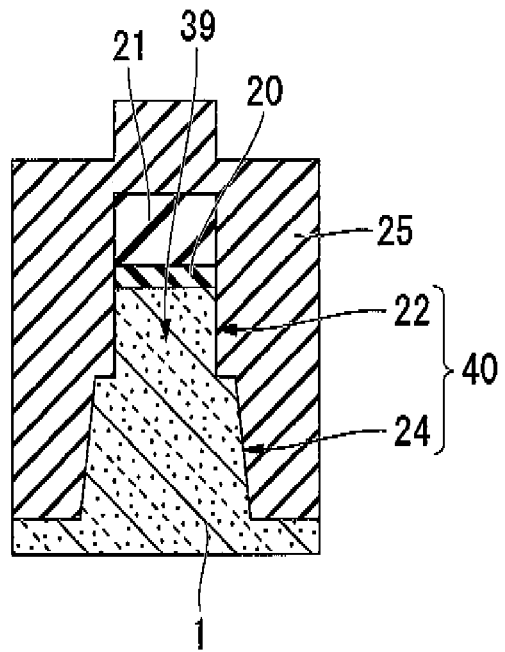

FIGS. 6A and 6B illustrate a state of a silicon oxide film 25 being formed. After the second recess 24 is formed, an element isolation insulating film 25 is formed so as to fill the recess 40 and to cover the silicon nitride film 21. The element isolation insulating film 25 is made of a silicon oxide film. Since the sidewall 23 and the element isolation insulating film 25 are made of a silicon oxide film, an illustration of the sidewall 23 is omitted in FIGS. 6A and 6B and the following drawings for simplification.

Figure 7A:
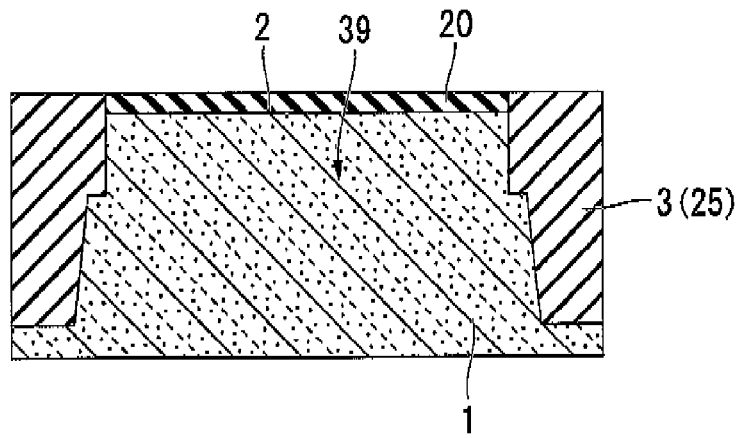
Figure 7B:
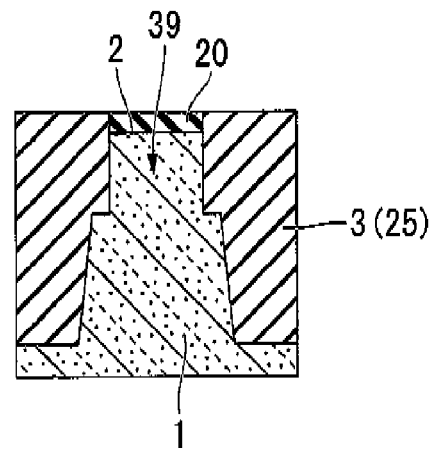

FIGS. 7A and 7B illustrate a state of a remaining portion of the silicon nitride film 21 being removed. After the element isolation insulating film 25 is formed, an upper surface of the element isolation insulating film 25 is planarized using a CMP (Chemical Mechanical Polishing) method until an upper surface of the silicon nitride film 21 is exposed.

Then, wet etching is carried out using a hydrofluoric acid solution and the like so that the upper surface of the element isolation insulating film 25 and the upper surface (main surface) of the semiconductor substrate 1 have substantially the same level. Thus, the element isolation region 3, which is made of the element isolation insulating film 25a, is formed.

Then, a remaining portion of the silicon nitride film 21 is removed using a heated phosphoric acid solution and the like. Thus, an upper surface of the silicon oxide film 20 is exposed as shown in FIGS. 7A and 7B. The protruding portion 39, which is defined by the element isolation region 3, forms the diffusion region (active region) 2.

Figure 8:
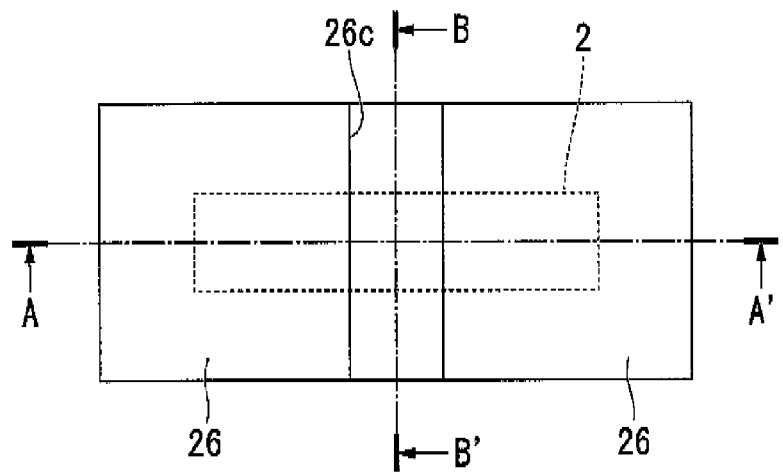
Figure 9A:
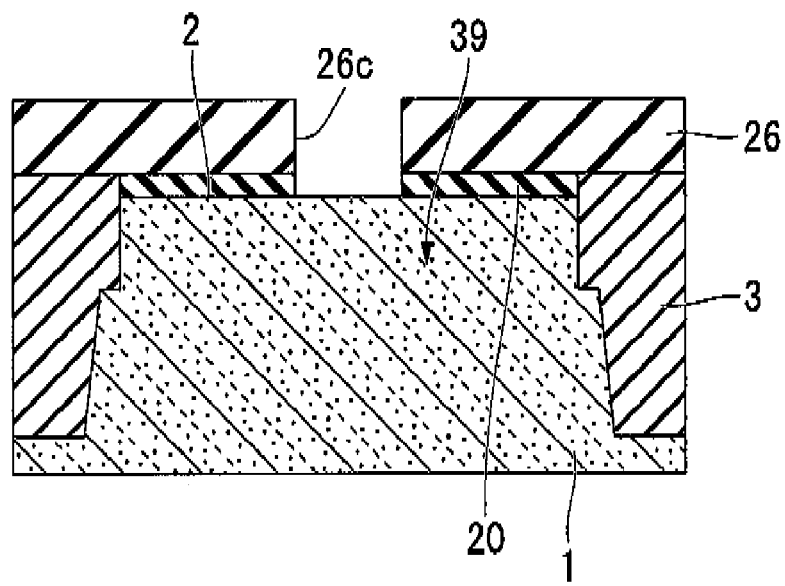
Figure 9B:
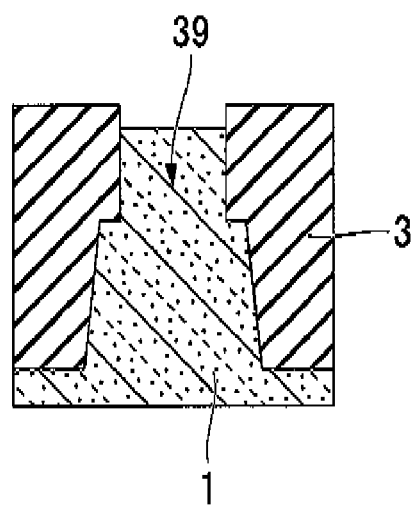

FIG. 8 is a plan view illustrating a state of a trench 26c being formed in a photoresist film 26. FIGS. 9A and 9B are cross-sectional views taken along lines A-A' and B-B' shown in FIG. 8, respectively. After the upper surface of the silicon oxide film 20 is exposed, a photoresist film 26 is formed so as to cover the silicon oxide film 20 and the element isolation region 3.

Then, the photoresist film 26 is patterned by photolithography to form the trench 26c, as shown in FIGS. 8, 9A, and 9B. The diffusion region (active region) 2 is a rectangular in plan view. The trench 26c crosses the diffusion region (active region) 2 in plan view so that the diffusion region (active region) 2 is partially exposed to the trench 26c.

Figure 10:
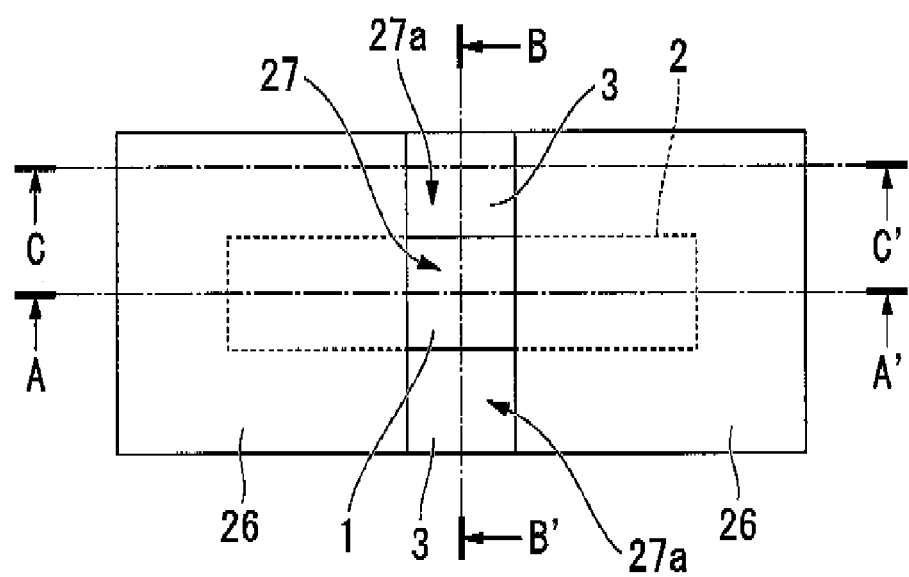
Figure 11A:
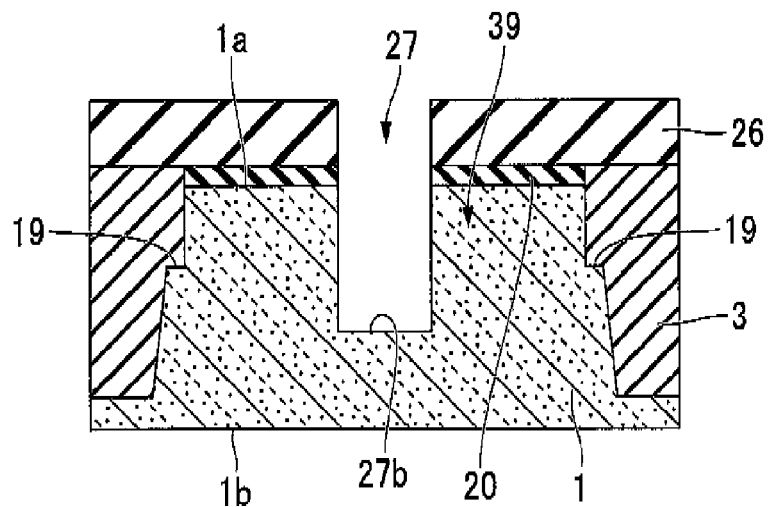
Figure 11B:
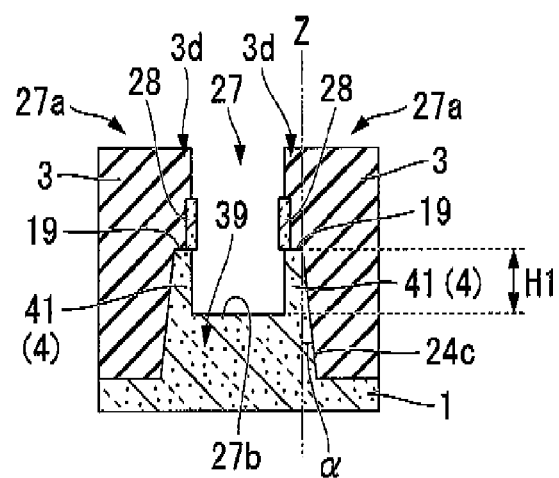
Figure 11C:
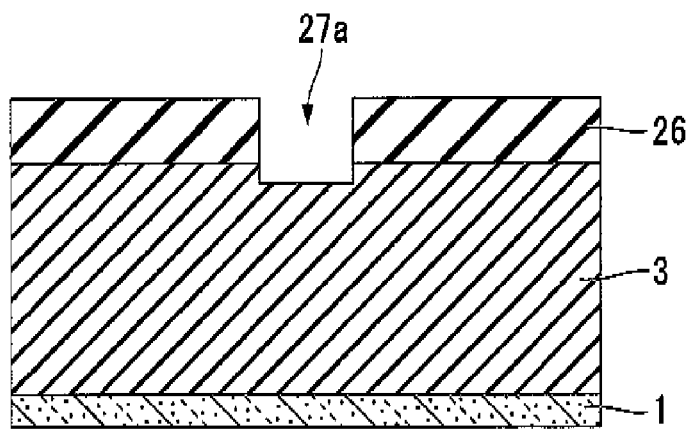

FIG. 10 illustrates a state of a recess 27 for forming a gate electrode being formed. FIGS. 11A, 11B, and 11C are cross-sectional views taken along lines A-A', B-B', and C-C' shown in FIG. 10. Then, the silicon substrate 1 is anisotropically dry-etched using the photoresist film 26 as a mask. A gas containing chlorine ($Cl_2$), hydrogen bromide (HBr), and oxygen ($O_2$) is used for the anisotropic etching.

Consequently, a portion of the silicon substrate 1, which is exposed to the trench 26c, is dry etched. Thus, the recess 27 for forming a gate electrode is formed. In this case, the silicon oxide film 20 is etched at the same time. However, the etching rate of the silicon oxide film 20 is smaller than that of the silicon substrate 1. For this reason, the etching amount of the silicon oxide film is small. Thus, a shallow recess 27a is formed in the element isolation region 3, as shown in FIGS. 11B and 11C.

As shown in FIG. 11B, the silicon substrate 1 has a thin film portion 41 that is exposed to the recess 27 and partially covers a side surface of the element isolation region 3. The thin film portion 41 is formed by forming the recess 27. The element isolation region 3 has an edge portion 3d that extends toward the active region 2 in plan view. The edge portion 3d is used as a mask for anisotropic dry etching of the silicon substrate 1.

The thin film portion 41 becomes wider in the downward direction. A height H1 of the thin film portion 41 equates a distance between the level of a bottom surface 27b of the recess 27 and the level of the step portion 19. The height H1 is approximately 50 to 70 nm.

The thin film portion 41 functions as a channel region 4 of the RC transistor. The horizontal width of the channel region is adjusted by changing the angle α between the vertical line and the side surface 24c of the second recess 24.

Generally, a bur portion 28, which is a thin silicon film, remains after the dry etching process. The bur portion 28 is positioned on the upper surface of the thin film portion 41 (channel region 4) and is attached onto the side surface of the element isolation region 3.

If a transistor is formed while the bur portion 28 remains, the bur portion 28 functions as a part of the channel region 4, thereby causing a decrease in the threshold voltage of the transistor, and therefore making a setting of the optimal operation characteristics difficult. For this reason, the bur portion 28 is preferably removed. Therefore, in the first embodiment, the bur potion 28 is removed by wet etching as will be explained in the next process.

Figure 12A:
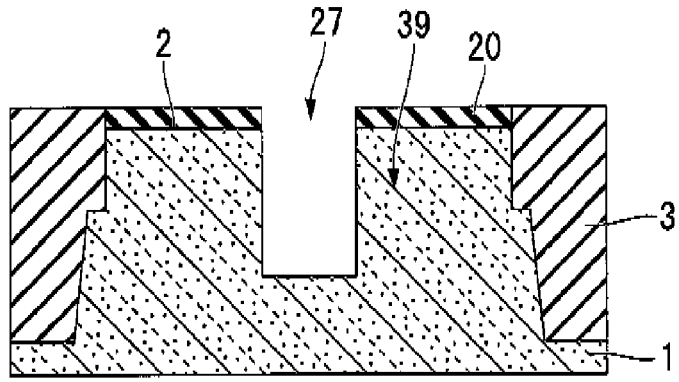
Figure 12B:
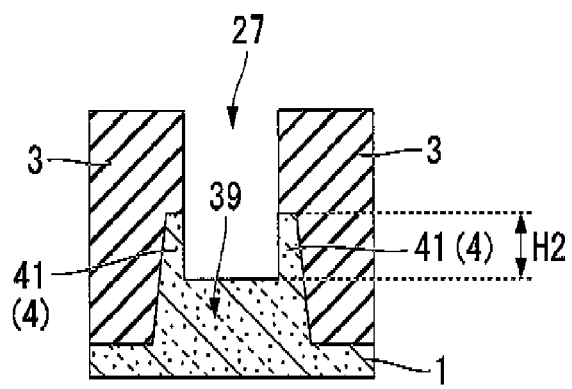
Figure 12C:
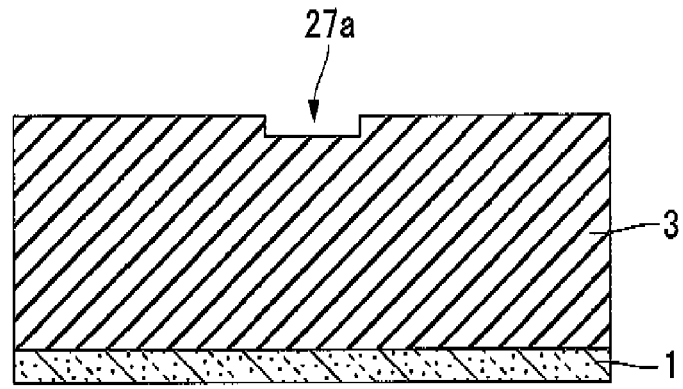

FIGS. 12A, 12B, and 12C are cross-sectional views taken along lines A-A', B-B', and C-C' shown in FIG. 10. After the silicon substrate 1 is anisotropically dry-etched, the photoresist film 26 is removed. Then, the semiconductor substrate 1 is placed into pure water that is heated to a temperature of approximately 70° C. Thus, the silicon substrate 1 is wet-etched. At the same time, the bur portion 28 can be completely removed. In this case, an upper region of the thin film portion 41 (channel region 4), which is subjected to an etching solution, is exposed. In this manner, the area of film portion 41 (channel region 4) that is subjected to the etching solution increases. Therefore, the height of the thin film portion 41 (channel region 4) can be quickly reduced by the wet etching. Consequently, a final height H2 of the thin film portion 41 (channel region 4) can be precisely adjusted to be in the rage of approximately 30 nm to 50 nm. At the same time, the side and bottom surfaces of the recess 27 are slightly wet-etched.

Preferably, pure water is used as a solution for wet-etching the silicon substrate 1. Pure water is used in cleaning processes and the like in general semiconductor-device manufacturing factories. Pure water is almost free of organic substances, fine particles, ions, gases such as oxygen, and the like.

Preferably, pure water is heated to approximately 70° C. or to 80° C. or lower. If pure water is heated to approximately 70° C., the thickness of the silicon substrate can be reduced by wet etching at the etching rate of approximately 1 nm per minute. Therefore, the etching rate can be adjusted to a proper value, thereby enabling precise control of the amount of the silicon substrate to be removed.

If pure water is heated to 80° C. or higher, a gas (such as oxygen) contained in the pure water is likely to produce bubbles and to become attached to the etching surface of the semiconductor substrate 1, thereby interrupting the etching process. On the other hand, the etching rate of the silicon substrate decreases as the temperature of pure water decreases. For this reason, the temperature of pure water is preferably set to 60° C. or higher in consideration of productivity.

If the bur portion 28 is removed by controlling only the dry etching conditions, over-etching occurs. Consequently, a level of an etched bottom surface of the recess 27 becomes too low. For this reason, the height H1 of the thin film portion 41 cannot be adjusted to a desired value. Additionally, the etching of the silicon substrate 1 proceeds too far in the horizontal direction. For this reason, a sufficient width of the channel region 4 cannot be achieved. If a dry etching time is reduced by controlling only the dry etching condition so as to adjust the height of the thin film portion 41 to be in the range of 30 nm to 50 nm, a greater amount of the bur portion 28 remains. For all the above reasons, it is difficult to remove the bur portion 28 and to properly adjust the shape and height of the thin film portion 41 by controlling only the dry etching conditions.

Figure 13A:
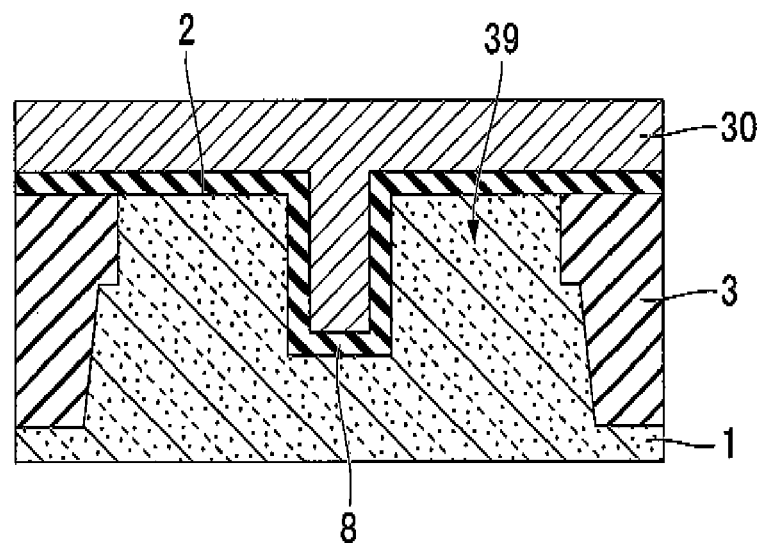
Figure 13B:
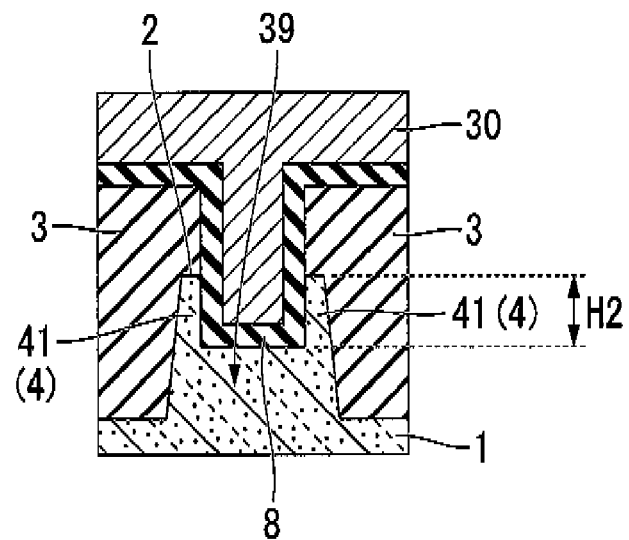

FIGS. 13A and 13B illustrate a state of a poly-crystalline silicon film 30 being formed. FIGS. 13A and 13B are cross-sectional views taken along lines A-A' and B-B' shown in FIG. 10, respectively. After the silicon substrate 1 is wet-etched, the silicon oxide film 20 is removed using a hydrofluoric acid solution and the like in order to expose an upper surface of the protruding portion 39.

Then, a gate insulating film 8 is formed so as to cover side and bottom surfaces of the recess 27, and upper surfaces of the protruding portion 39 and the element isolation portion 3. The gate insulating film 8 has a thickness of 4 nm to 8 nm. As the gate insulating film 8, a silicon oxide film, a multi-layered film including a silicon nitride film and a silicon oxide film, a high-dielectric High-k film (such as an HfSiON film), and the like are used.

Then, a poly-crystalline silicon (Poly-Si) film 30, into which phosphorus (P) is introduced as an n-type impurity, is formed by CVD so as to cover the gate electrode film 8 and to fill the recess 27, as shown in FIG. 13. The poly-crystalline silicon film 30 has a thickness of, for example, 80 nm. Alternatively, a poly-crystalline silicon film free of impurities may be formed over the gate insulating film 8, and then an n-type impurity may be ion-implanted into the poly-crystalline film to form the poly-crystalline film 30.

Figure 14:
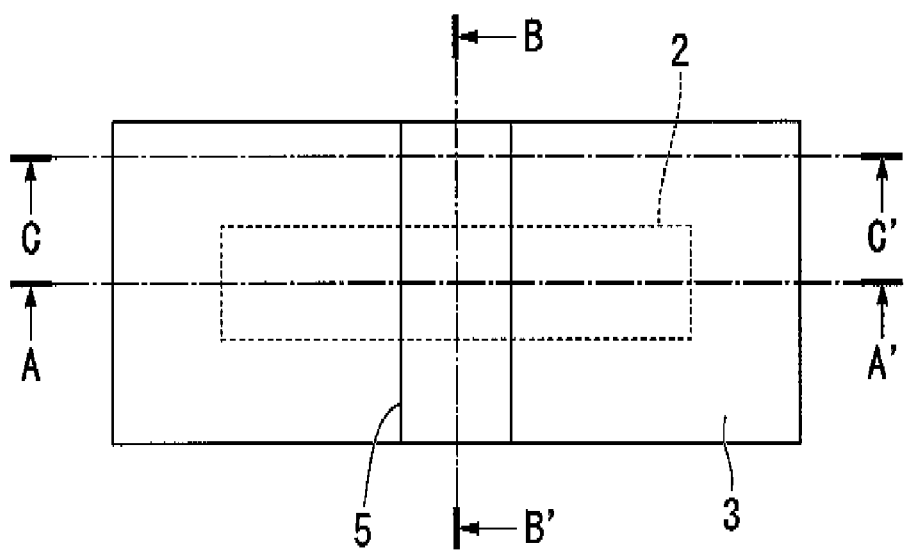
Figure 15A:
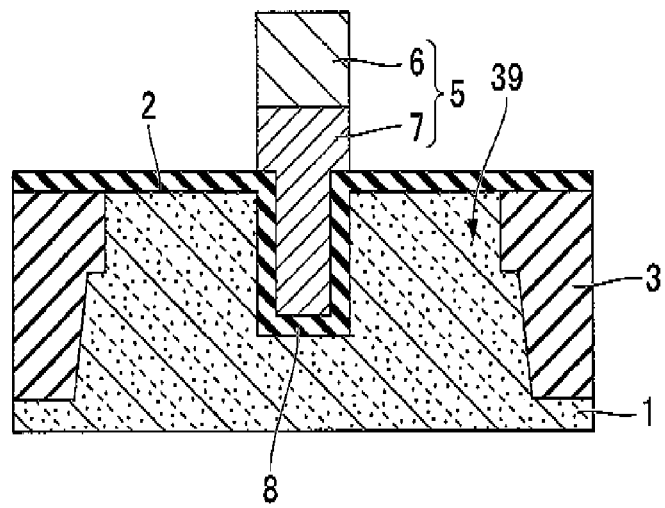
Figure 15B:
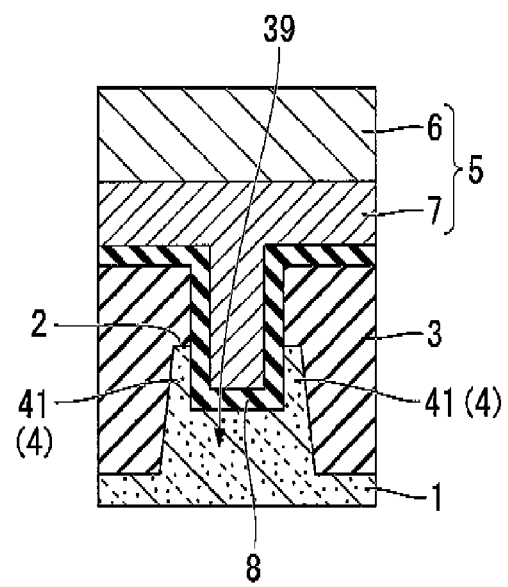
Figure 15C:
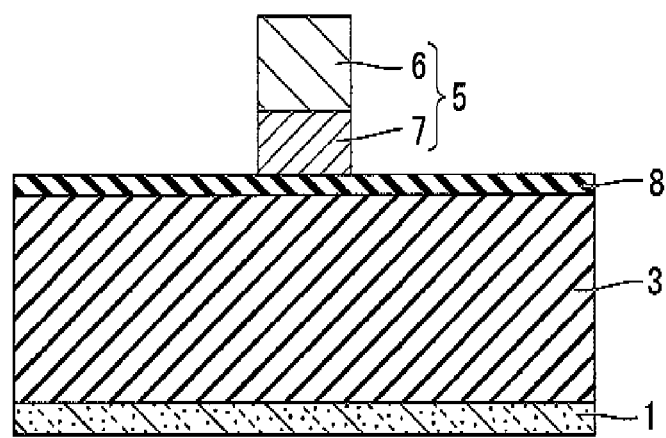

FIG. 14 is a plan view illustrating a gate electrode 5. FIGS. 15A, 15B, and 15C are cross-sectional views taken along lines A-A', B-B', and C-C' shown in FIG. 14, respectively.

After the poly-crystalline silicon film 30 is formed, boron (B) is ion-implanted into the semiconductor substrate 1 through the crystalline silicon film 30 to form an impurity doped layer (not shown) in the semiconductor substrate 1. The ion implantation is carried out at an energy of 50 KeV to 80 KeV. In this case, the threshold voltage of the transistor can be adjusted to a predetermined value by adjusting the concentration of boron (the dose amount of ion implantation). The impurity doped layer for adjusting the threshold voltage may be formed before the poly-crystalline film 30 is formed.

Then, a low-resistance conductive film is formed over the poly-crystalline film 30. As the low-resistance conductive film, a high melting point metal, such as tungsten (W), cobalt (Co), titanium (Ti), and a silicide compound including these substances (WSi, CoSi, TiSi) may be used. Alternatively, a barrier film including the above high melting point metal film and a high melting point metal nitride (WN, TiN, and the like) film may be used.

Then, a photoresist film is formed over the conductive film. Then, the photoresist film is patterned to form a photoresist mask (not shown) that covers only a region for forming a gate electrode.

Then, the conductive film and the poly-crystalline silicon film 30 are dry etched using the photoresist mask. Thus, a gate electrode 5, which includes a poly-crystalline silicon film 7 and a conductive film 6 over the poly-crystalline silicon film 7, is formed as shown in FIGS. 14, 15A, 15B, and 15C. The gate electrode 5 is rectangular in plan view. The gate electrode 5 crosses the diffusion region (active region) 2 in plan view. A lower portion of the poly-crystalline silicon film 7, which is covered by the gate insulating film 8, is disposed between the opposing thin film portions 41 (channel regions 4).

Figure 16A:
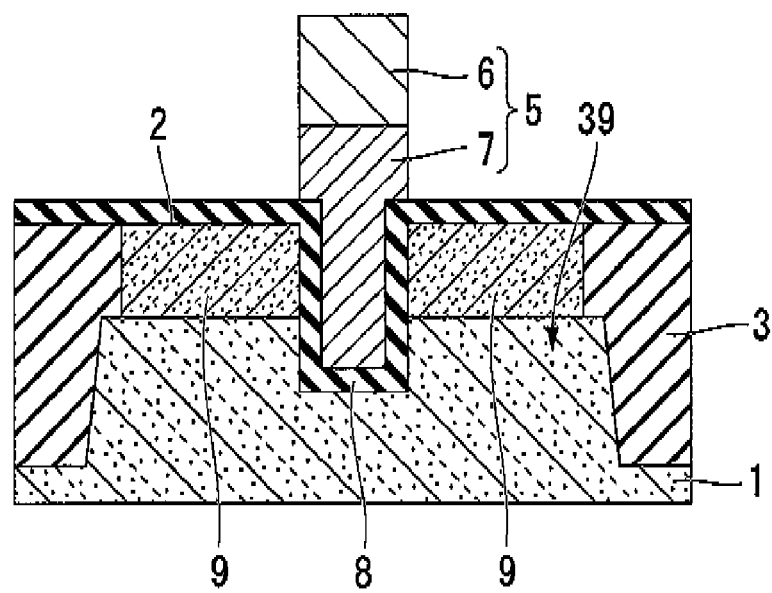
Figure 16B:
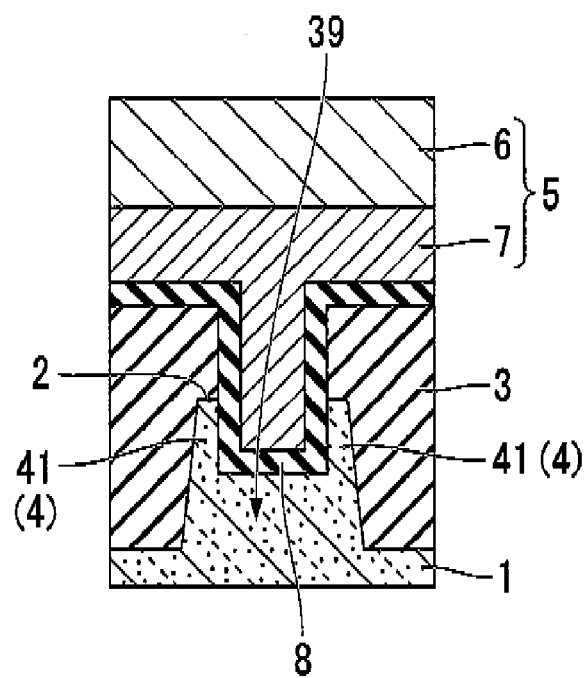

FIGS. 16A and 16B illustrate a state of an n-type impurity layer 9 being formed. FIGS. 16A and 16B are cross-sectional views taken along the lines A-A' and B-B' shown in FIG. 14.

After the gate electrode 5 is formed, phosphorus (P) is ion-implanted into a portion of the diffusion region 2, which is outside the gate electrode 5, in order to form an n-type impurity layer 9. The ion implantation is carried out at an energy of 10 KeV to 20 KeV, at a dose amount of $1 \times 10^{12}$ ions/cm$^2$ to $1 \times 10^{13}$ ions/cm$^2$. The n-type impurity layer 9 functions as a source or drain region.

Figure 17:
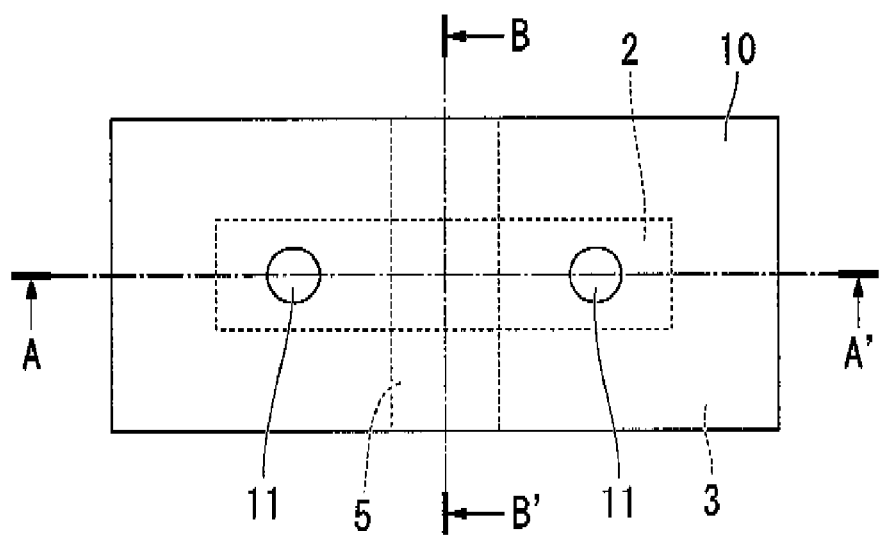
Figure 18A:
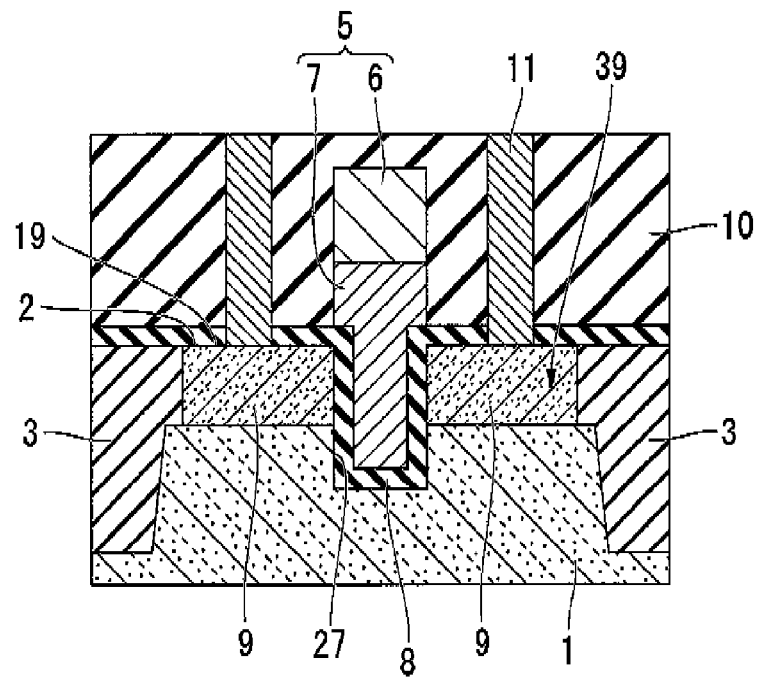
Figure 18B:
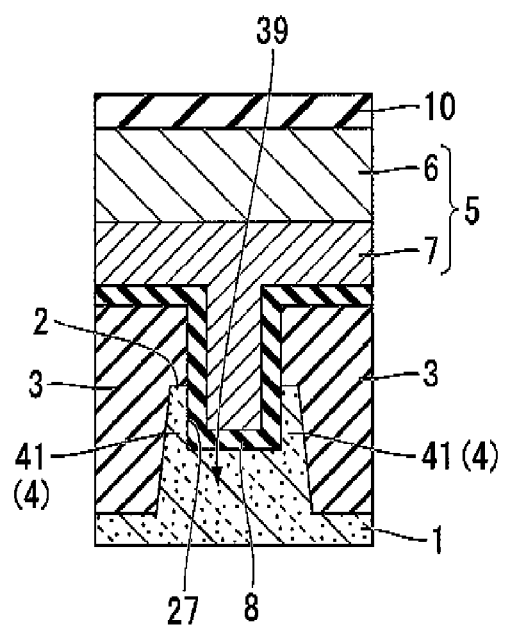

FIG. 17 is a plan view illustrating a contact plug 11. FIGS. 18A and 18B are cross-sectional views taken along lines A-A' and B-B' shown in FIG. 17. After the n-type impurity layer 9 is formed, an inter-layer insulating film 10 is formed so as to cover the gate electrode 5 and the gate insulating film 8. The inter-layer insulating film 10 is made of a silicon oxide film and the like.

Then, a hole is formed in the inter-layer insulating film 10 so as to expose an upper surface of the n-type impurity layer 9. Then, a conductive film is formed so as to fill the hole. The conductive film is made of a tungsten (W) film, a poly-crystalline silicon film into which an impurity is introduced, and the like. Thus, the contact plug 11, which is connected to the n-type impurity layer 9, is formed as shown in FIG. 18A.

Similarly, a lead-out contact plug (not shown) is formed for the gate electrode 5.

Then, a metal wiring layer (not shown), which is connected to the contact plug 11, is formed. The metal wiring layer is made of tungsten (W), aluminum (Al), copper (Cu), and the like. Thus, the RC transistor is complete.

FIG. 17 illustrates a rectangular region of the RC transistor. The region of the RC transistor is covered by the inter-layer insulating film 10. The strip diffusion region (active region) 2 crosses the strip gate electrode 5 in plan view. The element isolation region 3 surrounds the diffusion region 2. The two circular contact plugs 11 are formed in the diffusion region 2.

As shown in FIG. 18A, the semiconductor substrate 1 has a protruding portion 39 defined by the element isolation region 3. The protruding portion 39 includes two n-type impurity layers 9 that function as source and/or drain regions.

The gate electrode 5 fills the recess 27 formed in the semiconductor substrate 1. The gate electrode 5 is a multi-layered film including the poly-crystalline silicon film 7 and the conductive film 6 over the poly-crystalline silicon film 7. An upper portion of the gate electrode 5 upwardly extends from the main surface of the protruding portion 39. The gate electrode film 8 covers the inner and bottom surfaces of the recess 27, the upper surface 1a of the semiconductor substrate 1, and an upper surface of the element isolation portion 3.

The inter-layer insulating film 10 covers the gate electrode 5 and the gate insulating film 8. The contact plug 11 penetrates the inter-layer insulating film 10 and electrically connects the n-type impurity layer 9 to a wiring layer (not shown) that is formed over the inter-layer insulating film 10.

As shown in FIG. 18B, the poly-crystalline silicon film 7 included in the gate electrode 5 fills the recess 27. The bottom portion of the poly-crystalline silicon film 7, which is covered by the gate insulating film 8, is disposed between the opposing thin film portions 41. The thin film portion 41 has a sidewall shape, and becomes thicker in the downward direction.

The thin film portion 41 functions as the channel region 4 of the RC transistor. The opposing thin film portions 41 cover the bottom portion of the gate electrode 5 through the gate insulating film 8. When a voltage is applied to the gate electrode 5, the conductivity of the thin film portion 41 (channel region 4) changes from a p-type to an n-type. Thus, the two n-type impurity layers 9 communicate with each other when the RC transistor is in the on-state.

Although the case where the n-type transistor is formed has been explained as the first embodiment, the first embodiment may be applied to the case where a p-type transistor is formed. When a p-type transistor is formed, the conductivity of an impurity may be changed. In other words, when a p-type semiconductor substrate is used, an n-type well region is prepared. Then, an RC transistor is formed in the n-type well region. Then, boron or boron fluoride (BF$_2$) is ion-implanted into the n-type well region to form a p-type impurity layer that functions as a source or drain region. In this case, similar to the case of the n-type transistor, the voltage threshold can be adjusted by controlling the impurity concentration and the conductivity.

Although a single drain structure is formed in the first embodiment, an LDD (Lightly Doped Drain) structure may be formed to achieve higher performance of the transistor. Specifically, a sidewall, which is made of a silicon nitride film and the like, is formed by known technique so as to cover the side surface of the gate electrode. Then, in the case of forming an n-type transistor, an impurity, such as arsenic, is ion-implanted at a dose amount of $1 \times 10^{13}$ ions/cm$^2$ to $1 \times 10^{14}$ ions/cm$^2$. Thus, an LDD structure can be formed. Consequently, a resistance of the source or drain region as the LDD structure can be reduced, thereby achieving larger on-current.

Alternatively, a method for achieving higher performance, which is used for planar MOS transistors and trench gate transistors of the related art, may be used without departing from the scope of the present invention.

As explained above, according to the method of the first embodiment, the height H2 of the channel region 4 of the RC transistor can be adjusted to be in a predetermined range. Additionally, the bur portion 28, which remains adjacent to the channel region 4 and affects operations of the transistor, can be completely removed. Further, the thin film portion 41 (channel region 4) can be formed with the optimal shape and height for operation of the transistor. Accordingly, a current flowing in the channel region 4 can be stabilized, thereby stabilizing the operation characteristics of the RC transistor. Therefore, a high performance RC transistor can be easily formed.

Second Embodiment

Hereinafter, a method of manufacturing a semiconductor device according to a second embodiment of the present invention is explained. The second embodiment differs from the first embodiment in that the shape of the element isolation region 3 and the process of forming the element isolation region 3 are changed. It has been explained in the first embodiment that two etching processes are carried out to form the first and second recesses 22 and 24 which form the recess 40. On the other hand, in the second embodiment, only one etching process is carried out to form a recess 40b.

Figure 19A:
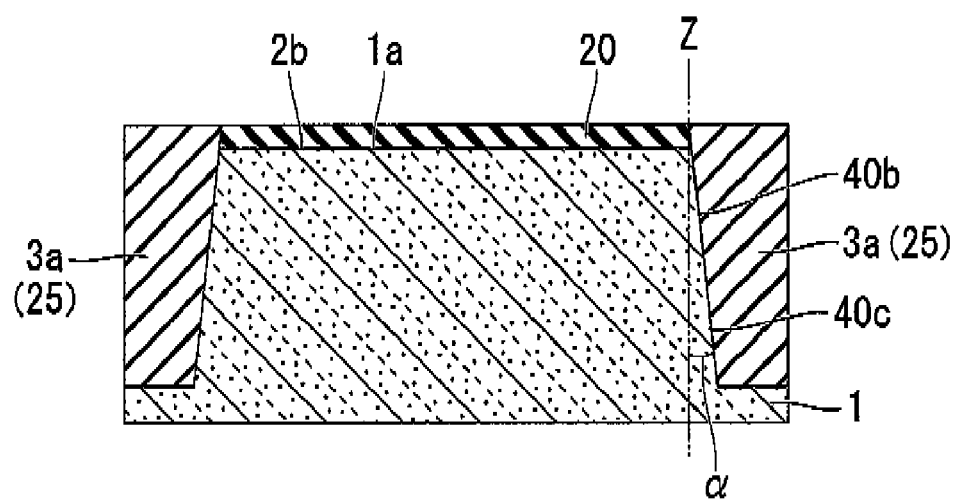
FIGS. 19A to 20B illustrate a process flow indicative of a method of manufacturing a semiconductor device according to a second embodiment of the present invention.
Figure 19B:
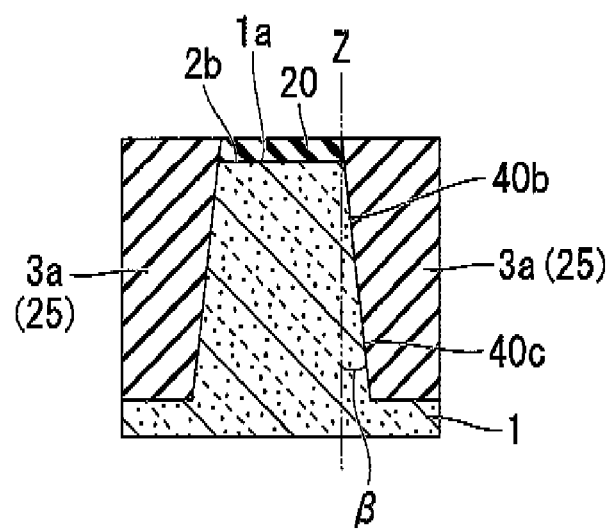

FIGS. 19A and 19B illustrate a state of an element formation region 3a being formed. FIGS. 19A and 19B are cross-sectional views taken along lines A-A' and B-B' shown in FIG. 1.

Similar to the first embodiment, the silicon oxide film 20, which has a thickness of approximately 9 nm, is formed over the semiconductor substrate 1 using thermal oxidation and the like. The silicon nitride ($Si_3N_4$) film 21, which has approximately 120 nm, is formed over the silicon oxide film 20.

Then, a photoresist film is formed over the silicon nitride film 21. Then, the photoresist film is exposed, and becomes a predetermined mask pattern. Then, the silicon nitride film 21 and the silicon oxide film 20 are patterned by dry etching using the predetermined mask pattern.

Then, the silicon substrate is dry-etched using the silicon nitride film 21 as a mask to form the recess 40b. The depth of the recess 40b is approximately 80 nm to 100 nm. The recess 40b becomes narrower in the downward direction. A side surface 40c of the recess 40b and a vertical line Z forms an angle β.

Then, the element isolation insulating film 25 is formed by CVD so as to fill the recess 40b and to cover the silicon nitride film 21. The element isolation insulating film 25 is made of a silicon oxide film. Then, an upper surface of the element isolation insulating film 25 is planarized by CMP.

Then, wet etching is carried out using a hydrofluoric acid solution and the like so that the upper surface of the silicon oxide film 25 and the upper surface 1a of the semiconductor substrate 1 have substantially the same level. Thus, an element isolation region 3a, which is made of the element isolation insulating film 25, is formed. A diffusion region (active region) 2b is defined by the element isolation region 3a. The silicon oxide film 20 remains in the diffusion region (active region) 2b.

Figure 20A:
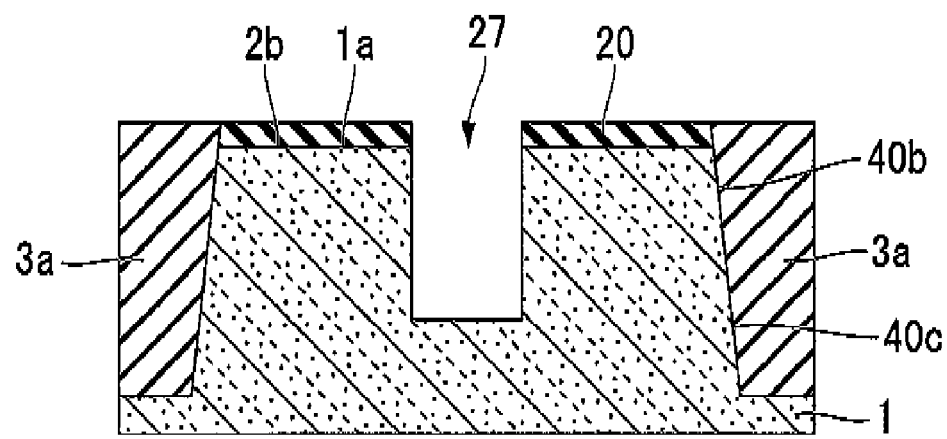
Figure 20B:
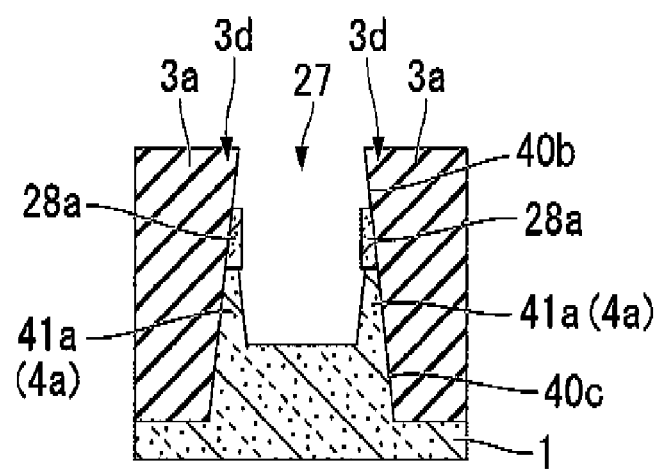

FIGS. 20A and 20B illustrate a state of the recess 27 being formed. FIGS. 20A and 20B are cross-sectional views taken along lines A-A' and B-B' shown in FIG. 1. After the element isolation region 3a is formed, a photoresist film is formed so as to cover the silicon oxide film 20 and the element isolation region 3a. Then, the photoresist film is patterned by photolithography so as to have an opening pattern.

Then, the silicon substrate is anisotropically dry-etched using the patterned photoresist film as a mask. Thus, the recess 27 is formed. In this case, a thin film portion 41a, which partially covers a side surface of the element isolation region 3, is formed by the anisotropic dry etching, as shown in FIG. 20B. At the same time, a bur portion 28a, which is a silicon thin film, remains on the top surface of the thin film portion 41a. The bur portion 28a partially covers the side surface of the element isolation region 3a.

The element isolation region 3a has an edge portion 3d which extends toward the active region 2. The edge portion 3d of the element isolation region 3a is used as a mask for anisotropic etching of the silicon substrate.

The thin film portion 41a becomes thicker in the downward direction. The height of the thin film portion 41a is approximately 50 nm to 70 nm. The thin film portion 41a functions as the channel region 4a of the RC transistor. The width of the channel region 4a can be adjusted by changing the angle β between the side surface 40c of the recess 40b and the vertical line Z.

As shown in FIGS. 20A and 20B, the recess 40b is formed by the one dry etching process, and therefore the step portion 19 of the first embodiment is not formed. For this reason, it is more difficult to control the height of the thin film portion 41a (channel region 4a).

Then, the silicon substrate is wet-etched using pure water that is heated to a temperature of approximately 70° C., similarly to the first embodiment. Thus, the bur portion 28a is removed, and the optimal height of the thin film portion 41a (channel region 4a) can be achieved.

Then, similar processes to those in the first embodiment are carried out. Thus, the RC transistor is complete.

According to the method of the second embodiment, the same effects as those of the first embodiment can be achieved.

Third Embodiment

Hereinafter, a method of manufacturing a semiconductor device according to a third embodiment of the present invention is explained. The third embodiment differs from the first embodiment only in that a heated phosphoric acid solution is used for wet-etching the silicon substrate.

As a solution used for wet-etching the silicon substrate, a solution with the low etching rate of the silicon substrate may be used. Accordingly, the height of the thin film portion 41a (channel region 4a) can be precisely adjusted.

In the third embodiment, a heated phosphoric acid ($H_3PO_4$) solution is used as the solution for wet-etching the silicon substrate. Specifically, a semiconductor substrate, which has been subjected to a predetermined preparing process, is placed in a phosphoric acid solution that is heated to a temperature of approximately 160° C., for approximately 60 minutes. Thus, substantially the same amount of the silicon substrate as in the first embodiment, in which heated pure water is used, can be removed. It is easier to control a formation of the channel region. When a phosphoric acid solution is used as a wet etching solution, the etching temperature is preferably set to be in the range of 150° C. to 170° C., in consideration of the etching rate.

Alternatively, APM (ammonia peroxide mixture) may be used as a solution for wet-etching the silicon substrate. In this case, however, the etching rate of the silicon substrate is higher when the APM is used than when heated pure water or a phosphoric acid solution is used. For this reason, the flexibility to control the shape and height of the thin film portion 41a (channel region 4a) degrades compared to the case of the first embodiment.

According to the third embodiment, the same effects as those of the first embodiment can be achieved.

Fourth Embodiment

Hereinafter, a method of manufacturing a semiconductor device according to a fourth embodiment of the present invention is explained. The fourth embodiment explains a case where an RC transistor formed by using the present invention is applied to a DRAM memory cell.

Figure 21:
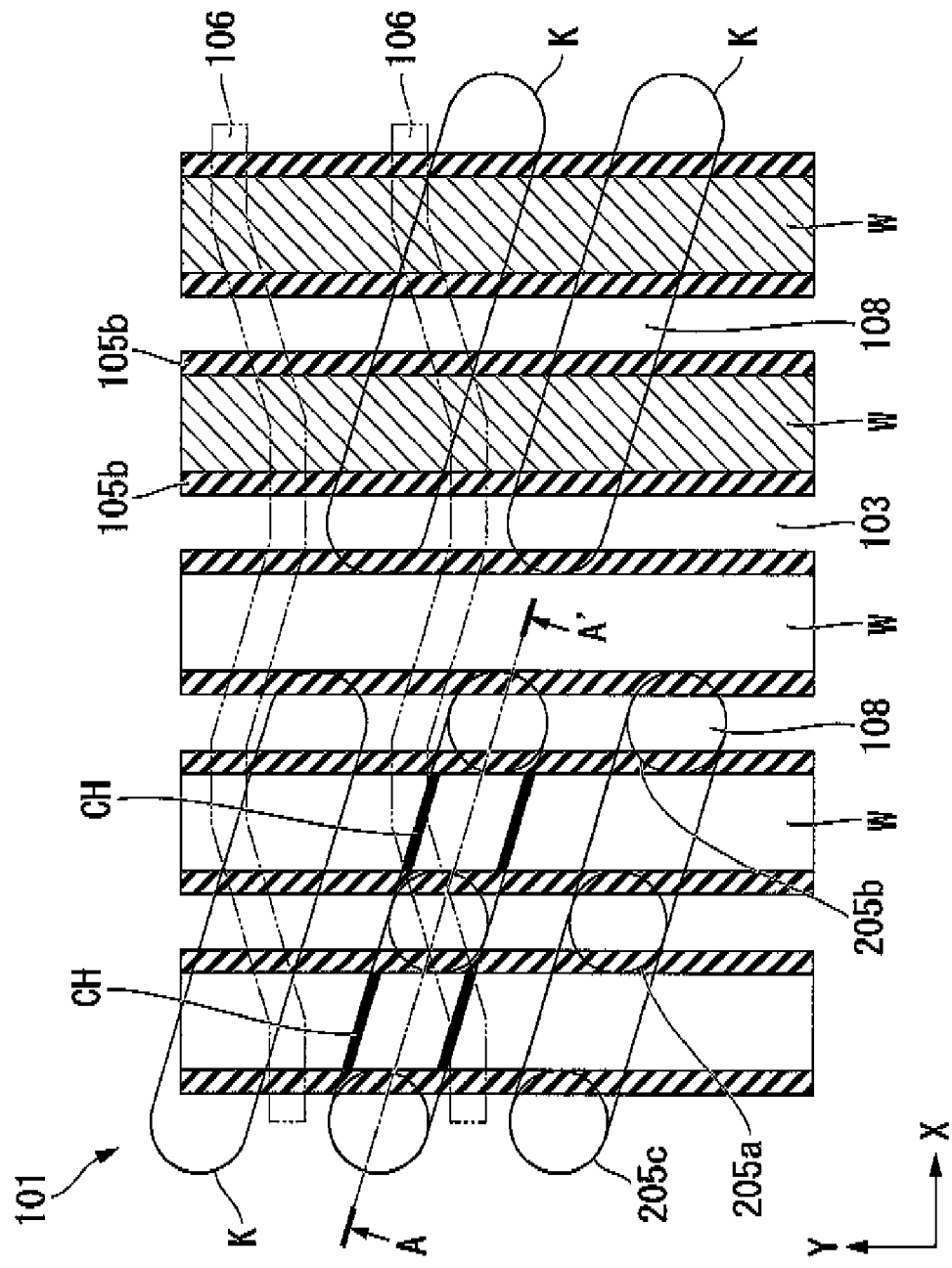
FIGS. 21 and 22 illustrate a method of manufacturing a semiconductor device according to a fourth embodiment of the present invention.
Figure 22:
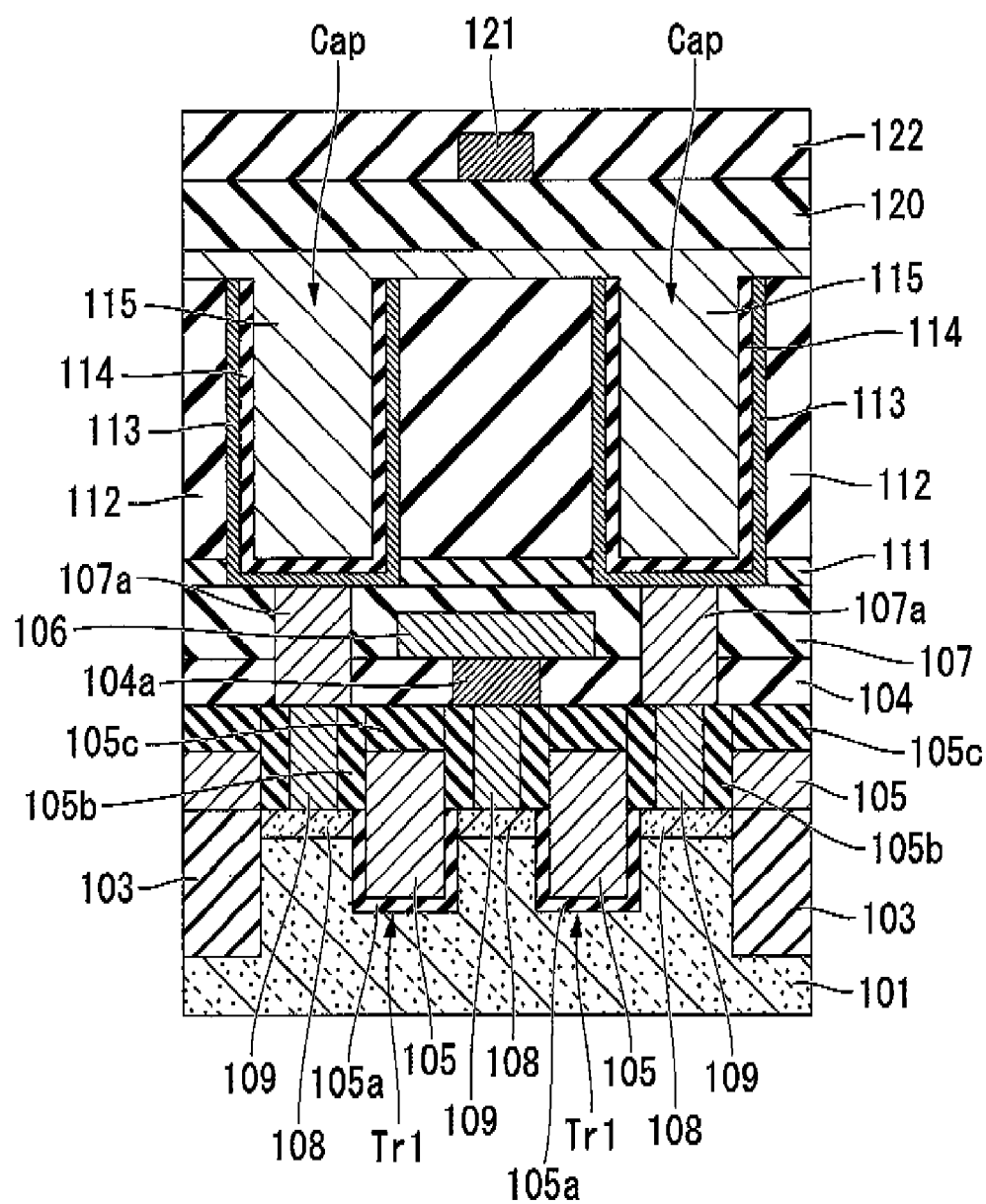

FIG. 21 is a plan view illustrating a memory cell portion of a DRAM element. FIG. 22 is a cross-sectional view taken along line A-A' shown in FIG. 21. The right side of FIG. 21 is a perspective view taken along a plane cutting a gate electrode 105 and a sidewall 105b. An illustration of capacitor elements is omitted in FIG. 21 for simplification, and is shown only in FIG. 22.

As shown in FIG. 21, curved bit wirings 106 extend in the X direction. The curved bit wirings 106 are arranged at a predetermined pitch in the Y direction. Straight word wirings W extend in the Y direction. The word wirings W are arranged at a predetermined pitch in the X direction. The sidewall 105b covers either side of the gate electrode (word wiring W). An impurity diffusion layer 108 and/or an element isolation region 103 are formed between each of the word wirings W. The impurity diffusion layer 108 is formed by, for example, introducing an n-type impurity, such as phosphorus, into a semiconductor substrate 101.

Multiple strip-shaped active regions K extend in the right lower direction. The active regions K are arranged at a predetermined pitch and thus form a 6F2 memory cell. The active regions K are defined by the element isolation region 103. Circular contact portions 205a, 205b, and 205c are formed in each active region K.

As shown in FIG. 22, the gate electrode 105 is formed in a region where each active region K crosses each word wiring W. The fourth embodiment is the case where the present invention is applied to a cell structure in which a 2-bit memory cell is disposed in one active region K.

As shown in FIG. 21, impurity diffusion layers 108 are separately formed in the semiconductor substrate 101 that is in the active region K defined by the element isolation region 103. The impurity diffusion layers 108 are adjacent to an upper surface of the semiconductor substrate 101. The impurity diffusion layer 108 functions as a source and/or drain region. The recessed gate electrode 105 is formed between each of the impurity diffusion layers 108.

The gate electrode 105 is made of a multi-layered film including a poly-crystalline silicon film and a metal film. An upper portion of the gate electrode 105 protrudes from the upper surface of a semiconductor substrate 101. The poly-crystalline silicon film can be formed by introducing an impurity, such as phosphorus, upon forming a silicon film using CVD. The metal film is made of a high melting point metal, such as tungsten (W), tungsten nitride (WN), tungsten silicide (WSi), and the like.

The impurity diffusion layers are formed in center and both side regions of each active region K. The impurity diffusion layers function as source and/or drain regions of a MOS transistor Tr1. The substrate contact portions 205a, 205b, and 205c are formed above the impurity diffusion layers (source and/or drain regions). Positions of channel regions CH of the gate electrode are transparently shown in FIG. 21 by heavy lines.

As shown in FIG. 22, the memory cell portion includes the MOS transistor Tr1, a capacitor element Cap, and a contact plug connecting the MOS transistor Tr1 and the capacitor element Cap. An RC transistor is used as the MOS transistor Tr1.

A substrate contact plug 109 is formed on the impurity diffusion layer 108. The substrate contact plug 109 is made of, for example, a poly-crystalline silicon film containing phosphorus. The positions of the substrate contact plugs 109 correspond to the positions of the contact portions 205a, 205b, and 205c. The substrate contact plug 109 has a self-alignment structure. In other words, a horizontal width of the substrate contact plug 109 is defined by the sidewall portions 105b covering the side surfaces of the gate electrode (word wiring W).

The semiconductor substrate 101 is made of silicon (Si) containing a p-type impurity at a predetermined concentration. The element isolation region 103 is formed in the semiconductor substrate 101 by embedding an insulating film, such as a silicon oxide ($SiO_2$) film, in the semiconductor substrate 101. The element isolation region 103 defines the active region (diffusion region) K and insulates the adjacent active regions K from each other.

When the element isolation region 103 is formed by two etching processes as explained in the method of the first embodiment, the element isolation region 103 has a step portion. However, an illustration of the step portion is omitted in FIG. 22.

A gate insulating film 105a is formed between the gate electrode 105 and the semiconductor substrate 101. The sidewall 105b, which is made of an insulating film such as a silicon nitride ($Si_3N_4$) film, covers the side surface of the gate electrode 105. An insulating film 105c, such as a silicon nitride film, covers an upper surface of the gate electrode 105.

A first inter-layer insulating film 104 covers the insulating film 105c and the substrate contact plug 109. The bit contact plug 104a penetrates the first inter-layer insulating film 104. The position of the bit contact plug 104a corresponds to the position of the substrate contact portion 205a. Thus, the bit contact plug 104a is electrically connected to the substrate contact plug 109. The bit contact plug 104a includes a barrier film and a tungsten film over the barrier film. The barrier film is a multi-layered film including a titanium (Ti) film and a titanium nitride (TiN) film. The bit wiring 106 is connected to the bit contact plug 104a. The bit wiring 6 is made of a multi-layered film including a tungsten nitride (WN) film and a tungsten (W) film.

A second inter-layer insulating film 107 covers the bit wiring 106. A capacitor contact plug 107a penetrates the first and second inter-layer insulating films 104 and 107 so as to be connected to the substrate contact plug 109. The capacitor contact plug 107a is positioned correspondingly to each of the substrate contact portions 205b and 205c.

A third inter-layer insulating film 111, which is made of a silicon nitride film, is formed over the second inter-layer insulating film 107. A fourth inter-layer insulating film 112, which is made of a silicon oxide film, is formed over the third inter-layer insulating film 111. The capacitor elements Cap penetrate the third and fourth inter-layer insulating films 111 and 112 so as to be connected to the capacitor contact plugs 107a.

The capacitor element Cap includes: a lower electrode 113; a high-dielectric capacitor insulating film 114 covering the lower electrode 113; and an upper electrode 115 covering the high-dielectric capacitor insulating film 114. The high-dielectric capacitor insulating film 114 is made of a zirconium oxide ($ZrO_2$) film, an aluminum oxide ($Al_2O_3$) film, a hafnium oxide ($HfO_2$) film, a multi-layered film including these films, and the like.

The lower and upper electrodes 113 and 115 are made of a metal film, such as a titanium nitride film. The lower electrode 113 is electrically connected to the capacitor contact plug 107a.

A fifth inter-layer insulating film 120, which is made of a silicon oxide film and the like, covers the upper electrode 115. A wiring layer 121, which is made of aluminum (Al), copper (Cu), and the like, covers the fifth inter-layer insulating film 120. A protection film 122 covers the wiring layer 121.

When the MOS transistor Tr1 becomes on-state, whether or not the capacitor element Cap is electrically charged can be determined. Thus, the MOS transistor Tr1 functions as a DRAM memory cell.

According to the method of the fourth embodiment, the same effects as those of the first embodiment can be achieved. Additionally, a DRAM element with excellent refresh characteristics and excellent data writing characteristics can be easily formed.

First Example

Hereinafter, examples of the present invention are explained. However, the present invention is not limited thereto. Firstly, a first example is explained here. The semiconductor device shown in FIG. 22 was formed by the following processes.

Firstly, a silicon oxide film, which has a thickness of 9 nm, was formed by thermal oxidation over a p-type silicon substrate (hereinafter, "semiconductor substrate"). Then, a silicon nitride ($Si_3N_4$) film, which has a thickness of 120 nm, was formed over the silicon oxide film.

Then, a photoresist film was formed over the silicon nitride film. Then, the photoresist film was exposed to form a desired mask pattern. Then, the silicon nitride film and the silicon oxide film were patterned by dry etching using the mask pattern. Thus, a rectangular silicon nitride film was formed over the silicon oxide film.

Then, the silicon substrate was dry-etched using the silicon nitride film as a mask. The dry etching was carried out at a pressure of 25 mTorr, with a gas containing chlorine ($Cl_2$), hydrogen bromide (HBr, and oxygen ($O_2$). Thus, a first recess having a depth of 120 nm was made in a region of the semiconductor substrate, which is not covered by the silicon nitride film. In this case, an angle between a side surface of the first recess and a vertical line was substantially zero.

Then, a silicon oxide film, which had a thickness of 18 nm, was formed by CVD so as to cover an inner surface of the first recess and an upper surface of the silicon nitride film. Then, dry etching was carried out to form a sidewall covering the side surface of the first recess.

Then, the silicon substrate was dry-etched using the silicon nitride film and the sidewall as masks to form a second recess having a depth of 90 nm. Thus, a protruding portion of the semiconductor substrate, which was defined by the first and second recesses, was formed. A side surface of the second recess was inclined so that the protruding portion becomes wider in the downward direction.

Then, an element isolation insulating film, which was made of a silicon oxide film, was formed by CVD so as to fill the recesses and the silicon nitride film. Then, an upper surface of the element isolation insulating film was planarized by CMP. Then, wet etching with a hydrofluoric acid solution was carried out so that the etched upper surface of the element isolation insulating film and the upper surface of the semiconductor substrate have substantially the same level. Thus, an element isolation region, which was made of a silicon oxide film, was formed.

Then, a remaining portion of the silicon nitride film was removed using a heated phosphoric acid solution. Then, a photoresist film was formed so as to cover the silicon oxide film and the element isolation region. Then, the photoresist film was patterned by photolithography such that an opening pattern, which crosses a center region of the diffusion region (active region) in plan view, was formed in the photoresist film.

Then, the silicon substrate was anisotropically dry-etched using the photoresist film as a mask. The anisotropic dry etching was carried out using a gas containing chlorine ($Cl_2$), hydrogen bromide (HBr), and oxygen ($O_2$). Thus, a portion of the silicon substrate, which was exposed to the opening pattern, was removed to form a recess. A shallow recess was formed in a region of the element isolation region, which was not covered by the photoresist film.

At the same time, a thin film portion was formed, by the dry etching of the silicon substrate, between the recess and the element isolation region. The thin film portion covered a lower surface of the recess. The thin film became thicker in the downward direction. A height of the thin film portion was 60 nm. Further, a bur portion, which was a silicon thin film, remained attached to the upper surface of the thin film portion and the side surface of the element isolation region. After the anisotropic dry etching, the photoresist film was removed.

Then, the semiconductor substrate was placed, for 20 minutes, in pure water that was heated to a temperature of 70° C. Thus, the semiconductor substrate was wet-etched to completely remove the bur portion. Thus, the height of the thin film portion (i.e., channel region) became 40 nm.

Then, the silicon oxide film was removed using a hydrofluoric acid solution to expose an upper surface of the silicon substrate in the diffusion region. Then, a gate insulating film, which was made of a silicon oxide film having a thickness of 6 nm, was formed so as to cover the exposed surface of the silicon substrate and the upper surface of the element isolation region.

Then, a phosphorus-doped poly-crystalline silicon film, which had a thickness of 80 nm, was formed by CVD so as to cover the gate insulating film and to fill the recess. Then, boron (B) was ion-implanted, at an energy of 60 KeV, into the semiconductor substrate through the poly-crystalline silicon film to form an impurity doped layer.

Then, a conductive film, which was made of tungsten (W), was formed over the poly-crystalline silicon film. Then, a photoresist film was formed over the conductive film. Then, the photoresist film was patterned to form a photoresist mask covering only a region for forming a gate electrode. Then, the conductive film and the poly-crystalline silicon film were dry-etched using the photoresist mask to form a gate electrode that had a strip shape in plan view.

Then, phosphorus (P) was ion-implanted into the diffusion region to form an n-type impurity diffusion layer that would be a source and/or drain region. The ion implantation was carried out at an energy of 15 KeV, at a dose amount of $5 \times 10^{12}$ ions/$cm^2$.

Then, an inter-layer insulating film, which was made of a silicon oxide film, was formed so as to cover the gate electrode and the gate insulating film. Then, a hole was formed in the inter-layer insulating film so as to expose an upper surface of the n-type impurity diffusion layer. Then, a conductive film, which was made of tungsten (W), was formed so as to fill the hole. Thus, the contact plug was formed.

Then, a lead-out contact plug was formed for the gate electrode. A metal wiring layer, which was made of tungsten, was formed so as to be connected to the contact plug.

Thus, an RC transistor was complete. Further, a DRAM element with 50 nm design rule was formed using the RC transistor as a memory cell. Then, the relationship between the height of the thin film portion in the channel region of the RC transistor and the operation characteristics of the DRAM element was evaluated.

Second and Third Examples, and First to Fourth Comparative Examples

Similar to the first example, six DRAM elements including the RC transistor were formed as second and third examples, and first to fourth comparative examples. A height of the thin film portion of the second example was 30 nm. A height of the thin film portion of the third example was 50 nm. A height of the thin film portion of the first comparative example was 10 nm. A height of the thin film portion of the second comparative example was 20 nm. A height of the thin film portion of the third comparative example was 60 nm. A height of the thin film portion of the fourth comparative example was 70 nm. Elements other than the thin film portion were the same as those of the first example.

Then, the relationship between the height of the thin film portion (channel region) and the operation characteristics of the DRAM element was evaluated for each example, similarly to the first example. Consequently, the following results were obtained.

When the height of the thin film portion (channel region) was set to be in the range of approximately 30 nm to 50 nm, the operations of the DRAM elements were the most stable. When the height of the thin film portion (channel region) was set to be approximately 50 nm or higher, the threshold voltage of the RC transistor was decreased. The decrease in the threshold voltage can be prevented by increasing a concentration of an impurity introduced into the channel region (impurity having a conductivity that is different from that of the source and/or drain region). However, the field strength increases at an edge of the source and/or drain region, and therefore leak current increases in the off-state. For this reason, the refresh characteristics (data holding characteristics) of the DRAM element were degraded.

On the other hand, when the height of the thin film portion (channel region) was set to be approximately 30 nm or lower, the on-current and an S coefficient (sub-threshold coefficient) of the RC transistor decreased. For this reason, the characteristics of writing of data in the capacitor element were degraded.

The present invention is applicable to semiconductor device manufacturing industries.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, and may be modified and changed without departing from the scope and spirit of the invention.

What is claimed is:

1. A method of manufacturing a semiconductor device, comprising:
    forming a first recess in a semiconductor substrate to define an active region on the semiconductor substrate, the active region including a protruding portion of the semiconductor substrate surrounded by the first recess, and the protruding portion having a sloped side surface;
    forming a first insulating film that fills the first recess;
    forming a gate recess in the active region to form a thin film portion that upwardly extends, the thin film portion being positioned between the gate recess and the first insulating film, the thin film portion being a part of the protruding portion; and
    removing an upper part of the thin film portion by wet-etching to adjust a height of the thin film portion,
    wherein the upper part of the thin film portion is removed by using pure water as a solution for the wet-etching.

2. The method according to claim 1, wherein forming the gate recess comprises removing a part of the protruding portion in the active region by dry-etching.

3. The method according to claim 1, wherein a temperature of the pure water is set in the range of 60° C. to 80° C.

4. The method according to claim 1, wherein the height of the thin film portion is adjusted in the range of 30 nm to 50 nm by the wet-etching.

5. The method according to claim 1, wherein forming the first recess comprises changing an angle between the sloped side surface of the protruding portion and a plane perpendicular to an upper surface of the semiconductor substrate in order to enlarge a horizontal thickness of the thin film portion.

6. The method according to claim 1, further comprising:
    after removing the upper part of the thin film portion, forming a second insulating film covering an inner surface of the gate recess and an upper surface of the active region; and
    forming a gate electrode on the second insulating film, the gate electrode filling the gate recess and covering a part of the active region.

7. The method according to claim 6, further comprising:
    after forming the gate electrode, introducing an impurity into the active region through the second insulating film to form source/drain regions;
    forming a third insulating film over the gate electrode and the active region; and
    forming contact plugs penetrating the second insulating film, each of the contact plugs being electrically connected to each of the source/drain regions.

8. A method of manufacturing a semiconductor device, comprising:
    forming a first recess in a semiconductor substrate to define an active region on the semiconductor substrate, the active region including a protruding portion of the semiconductor substrate surrounded by the first recess, and the protruding portion having a sloped side surface;
    forming a first insulating film that fills the first recess;
    forming a gate recess in the active region to form a thin film portion that upwardly extends, the thin film portion being positioned between the gate recess and the first insulating film, the thin film portion being a part of the protruding portion; and
    removing an upper part of the thin film portion by wet-etching to adjust a height of the thin film portion,
    wherein the upper part of the thin film portion is removed by using phosphoric acid solution as a wet-etching solution.

9. The method according to claim 8, wherein a temperature of the phosphoric acid solution is set in the range of 150° C. to 170° C.

10. A method of manufacturing a semiconductor device, comprising:
forming a first recess in a semiconductor substrate to define an active region on the semiconductor substrate, the active region including a first protruding portion of the semiconductor substrate surrounded by the first recess;
forming a mask insulating film on a side surface of the first protruding portion;
forming a second recess under the first recess using the mask insulating film as a part of a dry-etching mask to form a second protruding portion under the first protruding portion, the second protruding portion having a sloped side surface, and the active region including the second protruding portion of the semiconductor substrate surrounded by the second recess;
forming a first insulating film filling the first and second recesses;
forming a gate recess in the active region to form a thin film portion that upwardly extends, the thin film portion being positioned between the gate recess and the first insulating film, the thin film portion being a part of the second protruding portion, and a bottom surface of the gate recess reaching to the second protruding portion; and
removing an upper part of the thin film portion by wet-etching to adjust a height of the thin film portion,
wherein the upper part of the thin film portion is removed by using pure water as a solution for the wet-etching.

11. The method according to claim 10, wherein
the side surface of the first protruding portion is substantially perpendicular to an upper surface of the semiconductor substrate, and
the second protruding portion is larger in horizontal thickness than the first protruding portion.

12. The method according to claim 11, wherein forming the second recess comprises changing an angle between a side surface of the second protruding portion and a plane perpendicular to the upper surface of the semiconductor substrate in order to enlarge a horizontal thickness of the thin film portion.

13. The method according to claim 10, wherein a temperature of the pure water is set in the range of 60° C. to 80° C.

14. The method according to claim 10, wherein the height of the thin film portion is adjusted in the range of 30 nm to 50 nm by the wet-etching.

15. A method of manufacturing a semiconductor device, comprising:
forming a recess in a semiconductor substrate to form a thin film portion, the semiconductor substrate having a sloped side surface, the thin film portion being a part of the semiconductor substrate, and the thin film portion upwardly extending along a side surface of the recess; and
removing an upper part of the thin film portion by wet-etching to adjust a height of the thin film portion,
wherein the upper part of the thin film portion is removed by using pure water as a solution for the wet-etching.

16. The method according to claim 15, wherein a temperature of the pure water is set in the range of 60° C. to 80° C.

17. The method according to claim 15, wherein the height of the thin film portion is adjusted in the range of 30 nm to 50 nm by the wet-etching.

18. A method of manufacturing a semiconductor device, comprising:
forming a recess in a semiconductor substrate to form a thin film portion, the semiconductor substrate having a sloped side surface, the thin film portion being a part of the semiconductor substrate, and the thin film portion upwardly extending along a side surface of the recess; and
removing an upper part of the thin film portion by wet-etching to adjust a height of the thin film portion,
wherein the upper part of the thin film portion is removed by using pure phosphoric acid solution as a solution for the wet-etching.

19. The method according to claim 18, wherein a temperature of the phosphoric acid solution is set in the range of 150° C. to 170° C.

20. A method of manufacturing a semiconductor substrate, comprising:
forming a recess in a semiconductor substrate to form a thin film portion, the thin film portion extending upwardly along a side surface of the recess; and
removing an upper part of the thin film portion by wet etching to adjust a height of the thin film portion, the upper part of the thin film portion being removed by using one of pure water and phosphoric acid.

* * * * *